June 6, 1967 J. HILL 3,324,357

MULTI-TERMINAL SEMICONDUCTOR DEVICE HAVING ACTIVE ELEMENT DIRECTLY MOUNTED ON TERMINAL LEADS

Filed Dec. 28, 1964 2 Sheets-Sheet 1

Inventor
JOHN HILL
By Percy P. Lantzy
Attorney

Inventor
JOHN HILL
By Percy P. Lantzy
Attorney

United States Patent Office 3,324,357

Patented June 6, 1967

3,324,357

MULTI - TERMINAL SEMICONDUCTOR DEVICE HAVING ACTIVE ELEMENT DIRECTLY MOUNTED ON TERMINAL LEADS

John Hill, London, England, assignor to International Standard Electric Corporation, New York, N.Y., a corporation of Delaware Filed Dec. 28, 1964, Ser. No. 421,178

Claims priority, application Great Britain, Jan. 29, 1964, 3,786/64

7 Claims. (Cl. 317—234)

This invention relates to the mounting and encapsulation of semiconductor devices, and an object of the invention is to cheapen such processes.

The present invention provides an encapsulated semiconductor device which includes a semiconductor wafer having opposite type conductivity electrodes produced therein, a header for mounting such a wafer which header includes lead wires for making contact with said electrodes, and solder contacts between said electrodes and said lead wires.

The present invention also provides a process for the manufacture of encapsulated semiconductor devices from a slice in which the contacts to the electrodes of the individual devices are solder-coated before the semiconductor slice is separated into wafers, and in which individual wafers are mounted on headers and their electrodes are joined to the lead wires of the headers by soldering.

Methods of producing an encapsulated transistor, which is a particular type of seimconductor device, according to the present invention will now be described with reference to the accompanying drawings.

In the drawings:

FIGURE 1 is a representation of a silicon wafer in which is formed a transistor, the three contacts of which are all brought to the same face of the wafer, and on which are large area contacts of a deposited metallic film which adhere to both the oxide covering the silicon and the aluminium alloyed to the transistor contacts;

FIGURE 2 is in two parts. Part *a* is a sectional representation at AA in FIGURE 1, part *b* is a sectional representation at BB in FIGURE 1. Both sections are intended to represent a transistor either in the slice or when separated into wafers;

FIGURE 3 is in two parts. Part *a* is a representation of a prepared glass-metal header, suitable for acting as a mount for the transistor in FIGURE 1, and viewed from the side on which a mounting is to take place. Part *b* is a representation of the same header, viewed at right angles from part *a*;

A slice of n-type silicon has an array of npn transistors formed within one face by the planar technique, which utilises a layer of silicon oxide both as a diffusion mask and as a protection for the surface of the final device. These transistors are of the type described in U.S. patent application No. 386,148 filed July 30, 1964 (now abandoned) wherein all three electrode contacts of the individual transistors are brought to the same silicon surface.

Figure 1:
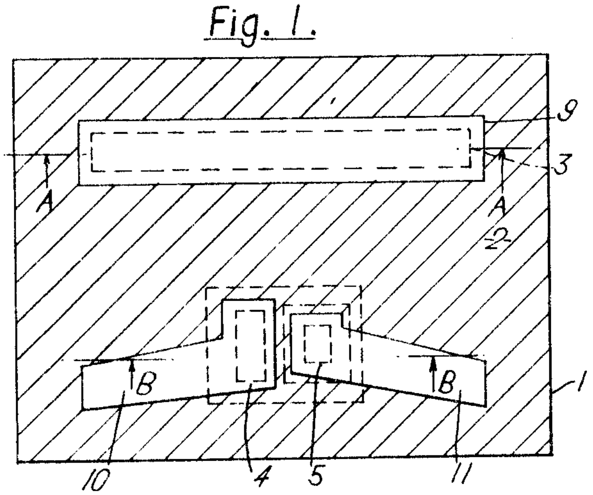
Figures 2A, 2B:
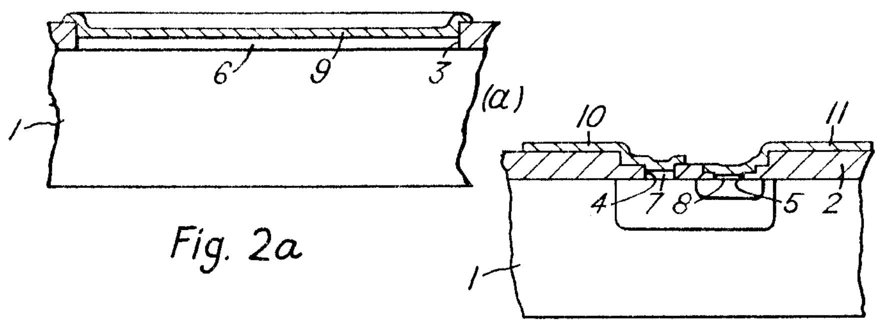

One such transistor is shown in wafer form in FIG. 1 and in sectional form, still within the slice, in FIG. 2. The surface of the silicon wafer 1 is left covered by an oxide layer 2 except for the exposed areas shown by the hidden detail 3, 4 and 5. Aluminium contacts to the collector, base and emitter regions are shown respectively at 6, 7 and 8 in FIG. 2 and may be formed in known manner by vacuum deposition, photoetch resist delimitation and alloying processes, if it is desired to use an intermediate contact material.

The large area contacts formed over the aluminium contacts, shown as 9, 10 and 11 in FIGURES 1 and 2, are of gold-chromium metallic film according to the method disclosed in U.S. patent application No. 312,930, now issued as U.S. Patent No. 3,270,256. They may be delimited in area by photo-etch-resist methods.

The slice is dipped in a fluxing solution and then into a solder bath containing, for example, tin-lead eutectic solder or Comsol, a silver-solder from Messrs. Johnson Matthey Ltd. On removal from the solder bath, low mounds of solder are formed on the large area contacts. After cleaning, the slice is separated into wafers, such as that illustrated in FIG. 1.

Figure 3:
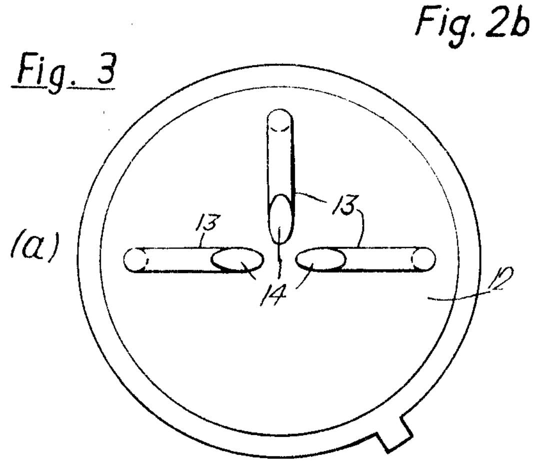
Figure 3:
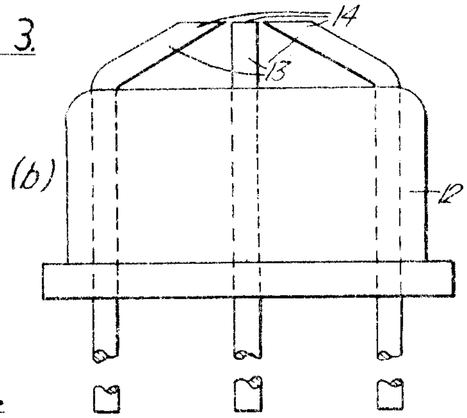

The headers on which the wafers are to be mounted are, typically, those suitable for the dimensionally standardized encapsulation designated SO–12 by the Electronic Valve and Semiconductor Manufacturers Association. The preferred variety of header, illustrated in FIG. 3, has three lead-wires passing through a glass-metal seal 12 and projecting on the other side. The lead-wires 13 are "formed" by bending their projecting ends inwards towards each other, and a flat 14 is produced on each of the three ends.

The three flats are approximately coplanar, the plane being at right angles to the general direction of the leads on the far side of the glass-metal seal and between 50 mils and 100 mils from the near face. The operation is so conducted that the three flats bear the relationship to one another, illustrated in FIG. 3, that makes it possible to place the transistor wafer on the header, contacts to flats, so that each contact rests on one flat and one flat only.

Figure 4:
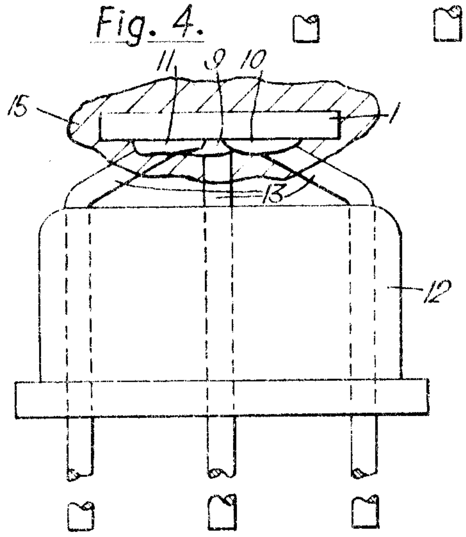
FIGURE 4 shows the header of FIG. 3 in side elevation with a transistor wafer in position on the header after the solder bonding operation, and with resin surrounding the wafer.

The mounting operation is conducted, first by assembling a header, prepared as above, and a transistor wafer, as illustrated in FIG. 4, so that the solder on each of the large area contacts of that transistor wafer is in contact with the flat at the end of the appropriate lead-wire. This assembly would normally be prepared so that the contact face of the transistor wafer is horizontal and facing downwards, although other configurations are suitable. The assembly is then heated, typically by a flow of heated non-oxidising gas, by the close proximity of a radiant heater, by contact with a heated member, by passing through a furnace, or in any other suitable manner.

The solder melts and wets the lead-wire ends, and this may require the use of a flux which could have been applied to either header or wafer before assembly. Such a flux would be water-soluble to make subsequent washing easier, a glutamic-acid/urea mixture being suitable. After cooling so that the solder solidifies, the assembly is removed from the mounting machine, washed to remove flux and other contaminants, and dried.

It is possible to electrically test the assembly at this stage.

A layer of silicon resin is placed over the semiconductor wafer and the formed wires to which it is soldered, and the assembly is heated to a temperature below the melting point of the solder to cure the resin. Resins MS997 or Megasil 1400 from Midland Silicones Ltd., London, are suitable for the purpose, which is to add mechanical strength to the soldered assembly. The resin is shown as item 15 in FIGURE 4.

Figure 5:
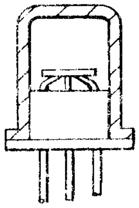
FIGURE 5 is a representation of the assembly of FIG. 3 with, in addition, a metallic cap welded over the assembly.

Final encapsulation is effected by fixing a metal cap over the header, by resistance "projection" welding, in the manner well known in the art, and illustrated in FIG. 5.

Encapsulation of the assembly may, alternatively, be conducted by surrounding the wafer, and filling the interstices between the wafer and face of the header, with a material which may be thermo-setting resin or a thermoplastic material.

Examples of the first class are epoxy resins and silicone resins, while examples of the second class are nylon and polypropylene. These materials would normally contain a "filler" of finely powdered material of low thermal expansivity in order to reduce the thermal expansivity of the "filled plastic." It is desirable to do this so as to match more nearly the low expansivity of silicon and to reduce stresses within the encapsulation.

Materials suitable for filling the plastic are powdered alumina, glass and similar substances. Typical pre-formulated resins for this purpose are Stycast 2762 made by Emerson and Cuming Inc. of Mass, U.S.A., and EMC90 made by Pacific Resins and Chemical Corporation of Seattle, Washington, U.S.A.

Figure 6:
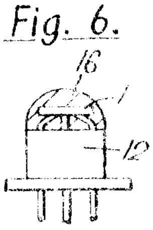
FIGURE 6 is a representation of a mounted transistor encapsulated with a plastic material which forms a shallow dome on the face of the header.
Figure 7:
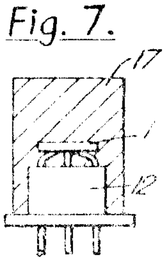
FIGURE 7 is a representation of a mounted transistor encapsulated with a plastic material which falls within the specification for a standardized outline.

The amount of encapsulating plastic to be used depends on the way in which the transistor is to be utilised in service. Moisture resistance alone may be achieved by a plastic layer of only a few mills thickness. The main requirements otherwise are protection from mechanical damage and assistance of thermal dissipation. A shallow dome of plastic 16, just sufficient to cover the wafer, as illustrated in FIG. 6, is sufficient to cover the water, as of mechanical protection. A moulding 17 up to the maximum dimensions allowed by the SO–12 outline, as illustrated in FIG. 7, might be preferable for the latter purpose.

In this description it will be assumed that a filled epoxy resin is being applied to the assembly, as in FIG. 4, by transfer moulding, by which is meant a known method of transferring molten heated epoxy resin under pressure from a heated container to prepared split-moulds along channels in the moulds provided for the purpose, the pressure being supplied by a hydraulically actuated plunger operating in the container. The flow of molten epoxy resin expels all the contained air from the moulds through the escape holes provided and then the resin solidities within the moulds under the applied pressure. A number of transistors, typically ten, are encapsulated in a single operation in each split-mould employed. A number of split-moulds, typically four, may be connected to the resin container for simultaneous resin transfer. It would be possible to substantially increase these numbers by appropriate design of the moulding apparatus.

The above embodiments of the invention have been described in terms of npn silicon planar transistors. It is equally possible to mount and encapsulate pnp silicon planar transistors or silicon planar diodes of pn or np configuration. In the latter case only two lead wires would be required in the header. Transistors and diodes made from other semiconducting materials are also suitable if they are properly passivated, that is if their surfaces are protected by an insulating layer. In the case of silicon the silicon oxide layer grown during the planar process serves this purpose. In the case of germanium, for example, it is possible to deposit silicon oxide on the surface to act in the same manner. Again, it is possible to deposit or grow a silicon oxide layer on the surface of silicon transistors or diodes made by other solid state diffusion techniques, for instance that known as the "mesa" technique. Other devices than transistors and diodes, such as silicon controlled rectifiers or solid state circuits, may also be mounted in the manner illustrated in the embodiment.

The embodiment described is based on devices made with non-epitaxial slices of silicon. It is equally possible to apply the invention to slices having a grown epitaxial layer, a process which has a large effect on the electrical parameters of the devices, but a negligible effect on the properties of the wafers that are important for the purposes of this invention.

Other variations in the methods used for the production of transistors with large area contacts on one face of the wafer would be acceptable provided that the prepared wafer is suitable for mounting as described. For example, the use of aluminium as a first contact material is not essential, and a deposited nickel layer could be used in place of the aluminium, or alternatively, this first contact material may be omitted.

An alternative form of contact to the collector to that shown as aperture 3 in FIGURE 1 in the embodiments, is to produce a groove across the wafer at substantially the same position as aperture 3, and to deposit the first contact material within the groove. The groove may be produced by etching or by mechanical methods. It would be produced whilst the transistors were still within the unseparated slice, the grooves being actually a series of grooves crossing the slice from edge to edge. Advantages gained by the alternative form of contact include ease of manufacture, ease of contacting to the finished wafer, and reduced collector series resistance, the last advantage deriving from the larger contact area and the penetration by the groove of the higher resistivity epitaxial layer, if one is utilised.

The wafer illustrated in FIG. 1 is suitable for use as described, but other configurations of large area contacts, and other configurations of flats at the ends of lead wires could be used. The respective wafer and header configurations would, however, have to be consistent.

Figure 8:
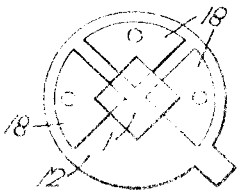
FIGURE 8 is a representation of a transistor wafer mounted on a header which bears deposited metallic film contacts, viewed from the mounting side.

An alternative form of header which serves the same purpose as that used in the embodiment is one in which the lead wires do not protrude beyond the glass of the seal at all, or only by a few mils. This header must be prepared for use by the deposition of areas of gold chrome film 18 on an insulating surface of the header, as illustrated in FIG. 8 for instance.

The description in terms of the SO–12 header is not intended to imply that this method of mounting and encapsulation is restricted to this particular size of component. The dimensionally standardized SO–3 header for instance, could be used with a larger power transistor, while smaller headers than the SO–12 could be used with the wafer described in the embodiment or with smaller wafers.

The purpose of the glass-metal seal in the embodiment is to act as a mount, to hold the lead-wires securely apart and insulated from each other. It is not necessary to use a glass-metal seal for this purpose, it being merely convenience that determined its choice. A ceramic-metal assembly or certain plastic-metal assemblies could be used in its place.

The use of silicone resin as an aid to mechanical strength, as described in the embodiment may not be required in all cases.

The plastic encapsulant 16 or 17 is, with advantage, made opaque by the inclusion of colouring matter. All semiconductor devices are to some extent photosensitive and, unless it is required to use the device for light detection purposes, it is advisable to exclude radiation of the waveband to which the particular semiconductor is sensitive. This is achieved by using a black dye. The use of opaque paint over the cured encapsulation also serves this purpose.

In certain circumstances it would be advantageous to place the plastic encapsulation in position in more than one process stage. For instance, a transistor encapsulated as in FIG. 6 with a low dome of plastic 16 could be converted to an SO–12 encapsulation 17, by a second operation. Again, it might be desired to include a piece of copper or similar material with good heat dissipation properties within the encapsulation. This could be achieved by incorporating this addition in a second process. It is not necessary for the plastics to be of the same type in succeeding processes. A thin, unfilled layer of, say, silicone resin might be applied and cured before the final encapsulation of, say, epoxy resin; or some form of rubber-like material might be used as a first stage of encapsulation.

The machine with which the wafer is mounted on its header may be a simple one, or it may be very complex. A simple arrangement requiring individual alignment by hand, using the eye as a guide, is adequate for the manufacture of acceptable assemblies in small numbers. Large scale production would, however, be effected on machines which automatically feed the piece-parts together, make the solder bond, and unload into magazines ready for the encapsulation operation. The use of such machines would make a lower production cost possible.

It is to be understood that the foregoing description of specific examples of this invention is made by way of example only and is not to be considered as a limitation of its scope.

What I claim is:

1. A semiconductor device, comprising:
- a die of semiconductor material having a plurality of electrodes on one major face thereof;
- a header; and
- a corresponding plurality of electrically conductive terminal leads supported by said header and insulated from one another,
- each of said leads having a rodlike portion extending from a given surface of said header, each said portion having an end contact area, said lead portion ends being bent toward each other such that each of said contact areas is adjacent and directly electrically bonded to a corresponding one of said electrodes such that said die is supported by said end contact areas, said areas being coplanar and comprising the only electrical connections to said die.

2. A semiconductor device according to claim 1, wherein said die comprises a transistor having three said electrodes.

3. A semiconductor device according to claim 1, further comprising a casing surrounding said die and bonded to said header to form a seal therewith.

4. A semiconductor device according to claim 1, further comprising a plastic material encapsulating said die and lead portions.

5. A semiconductor device according to claim 1, further comprising an insulating layer disposed on the portion of said major face which is free of said electrodes.

6. A semiconductor device according to claim 1, wherein at least one of said electrodes is raised above said major face.

7. A process for mounting a flat semiconductor wafer, having a plurality of separate electrodes on a common face, onto a header having an insulating base seal portion and a corresponding plurality of conductors extending therethrough, comprising the steps of:
- applying a coating of solder to said electrodes;
- bending the ends of said conductors into a wedge shape;
- forming coplanar flats on said ends; and
- bonding said flats to respective ones of said electrodes.

References Cited

UNITED STATES PATENTS

| | | | |
|---|---|---|---|
| 2,668,867 | 2/1954 | Elkstein | 317—235 |
| 2,799,814 | 7/1957 | Schwarz et al. | 317—235 |
| 2,862,160 | 11/1958 | Ross | 317—235 |
| 2,888,736 | 6/1959 | Sardella | 264—272 |
| 2,897,377 | 7/1959 | Nelson et al. | 317—235 X |
| 2,948,835 | 8/1960 | Runyan | 317—235 X |
| 2,965,962 | 12/1960 | Ollendorf et al. | 29—155.5 |
| 3,021,461 | 2/1962 | Oakes et al. | 317—235 |
| 3,159,775 | 12/1964 | Ingraham | 317—234 |
| 3,178,621 | 4/1965 | Blickman | 317—234 |
| 3,184,658 | 5/1965 | Littlepage et al. | 317—234 |
| 3,220,095 | 11/1965 | Smith | 317—234 |
| 3,225,416 | 12/1965 | Diebold | 29—25.3 |
| 3,239,719 | 3/1966 | Shower | 317—234 X |
| 3,241,010 | 3/1966 | Eddleston | 317—234 |
| 3,271,625 | 9/1966 | Caracciolo | 317—101 |

FOREIGN PATENTS

| | | |
|---|---|---|
| 1,154,874 | 9/1963 | Germany. |

JOHN W. HUCKERT, *Primary Examiner.*

R. F. POLISSACK, *Assistant Examiner.*